(12) United States Patent
Cho

(10) Patent No.: US 6,800,567 B2
(45) Date of Patent: Oct. 5, 2004

(54) METHOD FOR FORMING POLYATOMIC LAYERS

(75) Inventor: Ho Jin Cho, Kyoungki-Do (JP)

(73) Assignee: Hynix Semiconductor Inc., Kyoungki-Do (KR)

( * ) Notice: Subject to any disclaimer, the term of this patent is extended or adjusted under 35 U.S.C. 154(b) by 10 days.

(21) Appl. No.: 10/226,028

(22) Filed: Aug. 22, 2002

(65) Prior Publication Data

US 2003/0040197 A1 Feb. 27, 2003

(30) Foreign Application Priority Data

Aug. 27, 2001 (KR) .......................................... 2001-51654

(51) Int. Cl.$^7$ ........................ H01L 21/31; H01L 21/469
(52) U.S. Cl. ........................................ 438/763; 438/778
(58) Field of Search ................................ 438/758, 763, 438/778, 785

(56) References Cited

U.S. PATENT DOCUMENTS 6,096,592 A   8/2000   Cho

FOREIGN PATENT DOCUMENTS

KR   2000-0008815   2/2000

OTHER PUBLICATIONS

Communication from Korean Intellectual Property Office dated Jul. 30, 2003 (3 pages)

Primary Examiner—Van Thu Nguyen
Assistant Examiner—Beth E. Owens
(74) Attorney, Agent, or Firm—Marshall, Gerstein & Borun LLP

(57) ABSTRACT

A method for forming a polyatomic layer with a mixed deposition method consisting of an atomic layer deposition method (ALD) and a chemical vapor deposition method. The mixed deposition method can be adopted to form a polyatomic high dielectric layer, such as BST or STO. Accordingly, it is possible to form a polyatomic high dielectric layer having a uniform composition distribution, and thereby also having a high dielectric characteristic and a low leakage current characteristic.

18 Claims, 7 Drawing Sheets

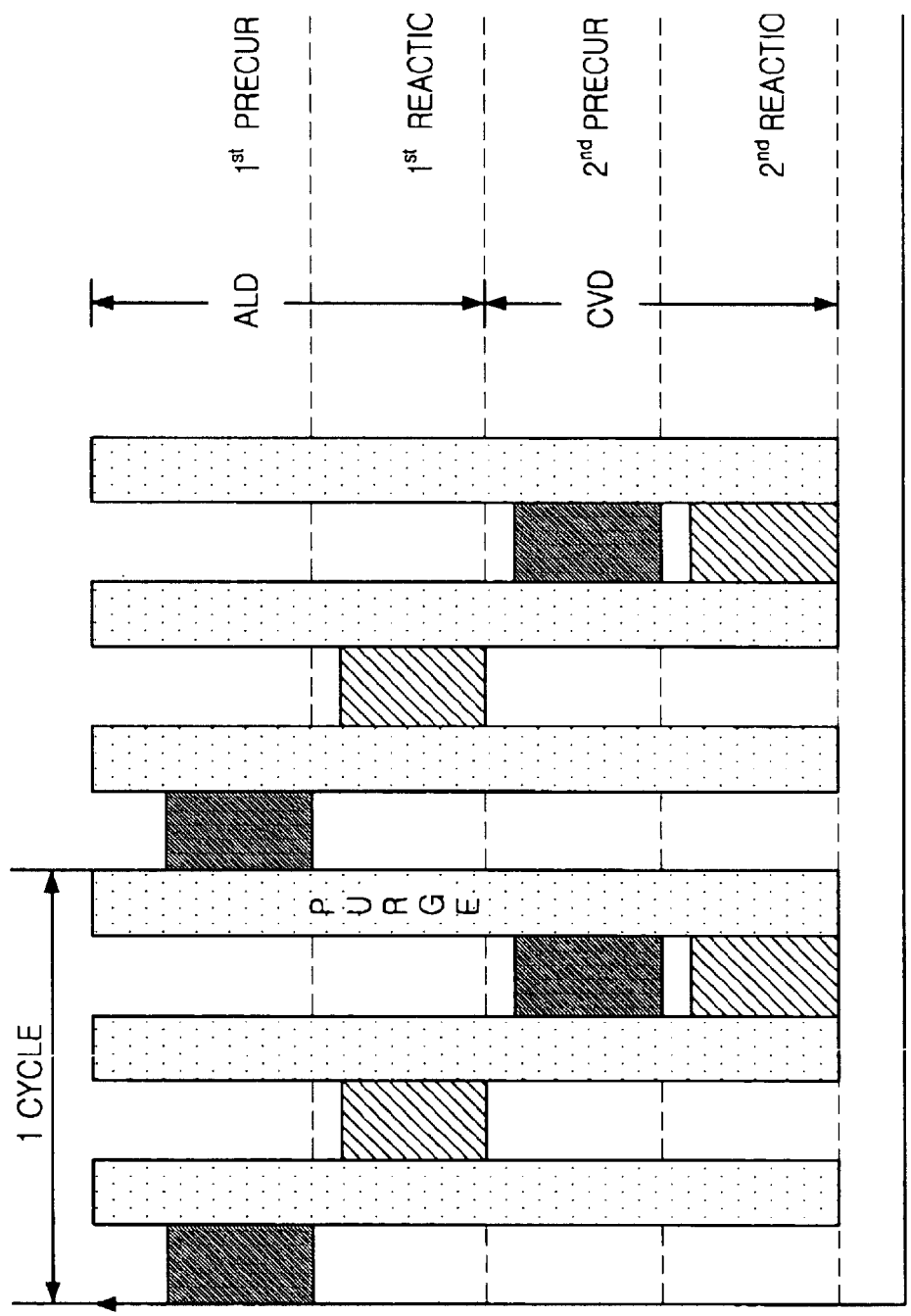

METHOD FOR FORMING POLYATOMIC LAYERS

TECHNICAL FIELD

Methods for fabricating highly integrated semiconductor devices are disclosed and, more particularly, methods for forming polyatomic layers of a semiconductor device are disclosed.

DESCRIPTION OF THE RELATED ART

Generally, as semiconductor devices become highly integrated and miniaturized, the area occupied by the constitutional elements gets smaller. Although as the size of a semiconductor device shrinks, however, a minimum capacitance should be secured to drive the device.

When fabricating a capacitor of a 64 Mbyte or 256 Mbyte-DRAM using a conventional dielectric material such as $SiO_2$ or $Si_3N_4$, the area occupied by the capacitor should be more than six times larger than the cell area to secure the essential capacitance, even though the $SiO^2$ or $Si_3N_4$ layer is made as thin as possible. As a planar capacitor cannot fulfill this condition, a method for increasing the charge storage area is sought.

Many structures including a stack capacitor, a trench capacitor, or a hemispheric polysilicon layer have been suggested to increase the charge storage area or, in other words, to increase the storage node surface area of a capacitor. However, in case the structure of a capacitor is made complicated just to increase its charge storage area, there are problems that the production cost goes up and that the efficiency declines due to the complex manufacturing process.

Therefore, it is hard to apply a method of increasing the charge storage area of a capacitor by forming it in three-dimensional and fulfilling capacitance to a DRAM device over a 1 Gb class.

To solve these problems, studies have been conducted on the $Ta_2O_5$ dielectric layer so as to substitute the conventional $SiO_2/Si_3N_4$ dielectric layer, but the capacitance of the $Ta_2O_5$ layer is no more than two to three times that of the $SiO_2/Si_3N_4$ dielectric layer. Accordingly, to employ a $Ta_2O_5$ dielectric layer to a highly integrated DRAM, the thickness of the dielectric layer must be reduced. But, this $Ta_2O_5$ dielectric layer creates a problem as the amount of leakage current increases.

For this reason, a high dielectric thin film is needed to fabricate a capacitor for 1 Gb DRAMs. When using a thin film with a high dielectric constant, it's possible to obtain adequate capacitance only by a planar capacitor, thus simplifying the manufacturing process.

A$(Ba,Sr)TiO_3$ (hereinafter referred as BST) layer has been studied a lot as a high dielectric material. The capacitor adopting the BST layer has a capacitance dozens of times as big as that of adopting the $SiO_2/Si_3N_4$ group as well as the structure and thermal stability of the capacitor adopting $SrTiO_3$ and the excellent electric property of the capacitor adopting $BaTiO_3$, which makes it an appropriate material for a memory device of over a 1 Gb class.

Among other materials having high dielectric constants, the BST layer of a perovskite structure is appropriately applicable to a high-density and high-integrated capacitor, which requires a high dielectric constant and small leakage current. This is because the BST layer features a high dielectric constant and superb insulation property with low dielectric dispersion and dielectric loss at a high frequency, and existing in a paraelectric at a room temperature. Furthermore, the BST layer doesn't have the problem of fatigue or degradation.

A polyatomic layer is formed with a sputtering deposition method, a chemical vapor deposition(CVD) method or an atomic layer deposition(ALD) method.

For forming a layer with the sputtering method, a high voltage is supplied to a target and inactive gases are injected to a vacuum chamber in order to generate plasma. For example, if an Ar gas is injected as the inactive gas, Ar ions are generated. The Ar ions are sputtered to the surface of the target and atoms are parted from the surface of the target. By this sputtering method, a thin film having high purity and good adhesion to a substrate may be deposited. However, in case of forming the multitudinous thin film composed of various atoms with the sputtering method, it is not easy to obtain the uniformity of the thin film, because the various atoms need the different optimum condition for depositing. Therefore, the sputtering method has limitations to be applied to form fine patterns.

The CVD is most widely used deposition method, a reaction gas and a source gas are used to form a thin film on a substrate to a required thickness. That is, various gases are injected to a reaction chamber, the gases excited by heat, light or plasma, chemically react each other, and the thin film is formed. In the CVD method, the deposition rate may be increased by controlling the deposition conditions, such as the plasma, chamber temperature and the ratio of reaction and source gases. However, it is difficult to control thermal stability of the atoms because of the rapid gas reaction and the physical and chemical properties of the thin film are deteriorated.

In the ALD method, a reaction gas and a purge gas are supplied alternately to form an atomic layer. The atomic layer formed with the ALD method shows good step coverage even if the atomic layer is formed on a structure having high aspect ratio, and it is possible to obtain a uniform layer at low pressure condition and to improve the electrical characteristic of the layer.

Lately, as the integration of the semiconductor device increases, the capacitor is formed with structures such as cylinder, fin, and stack structure, or is formed with a hemi spherical polysilicon layer in order to store much more charges in a small area. That is, the structure of charge storage electrodes of capacitors become complicated, therefore dielectric layers is formed with deposition methods, such as the ALD method, capable of guaranteeing good step coverage.

The ALD method use chemical reactions like as the CVD method, however the ALD method is distinguished from the CVD method in that the reaction gases are injected to a reaction chamber one by one without mixing between the reaction gases. For example, a gas A and a gas B are used as the reaction gases, firstly, the A gas is injected, and molecules of injected gas A are absorbed chemically on a substrate. Thereafter, inactive gases, such as Ar and $N_2$ are injected to the reaction chamber in order to purge the gas A remaining in the reaction chamber, and the gas B is injected to the reaction chamber. The injected gas B reacts with the molecules of the gas A only on the substrate, and an atomic layer is formed on the substrate. And then, the remaining gas B and accessory products are purged. The thickness of a layer is controlled by the repetition of the above-mentioned processes. Namely, the thickness of a layer formed by the ALD method closely relates to the number of repetition time.

Generally, the BST layer or STO layer is formed by the CVD method among above mentioned various deposition methods, and it is known that the BST layer has a best dielectric characteristics when the atomic ratio of Ba:Sr:Ti in the BST layer equals to 25:25:50. Therefore, in case of using the CVD method for forming the BST layer, for the purpose of obtaining intrinsic dielectric and excellent leakage current characteristics, it is needed to develop precursors and optimize the deposition condition in order to get the atomic ratio of Ba+Sr:Ti in the BST layer equal to 1:1. Hereinafter, Ba+Sr denotes a sum of atomic ratios of Ba and Sr.

FIG. 1 shows atomic ratio Sr/Ti dependency on step coverage, when a STO layer is formed in a three dimensional contact whose critical dimension CD is 0.15 µm. In FIG. 1, atomic ratio Sr/Ti dependencies of two STO layers are shown, that is, one STO layer is formed by flowing Sr source at a rate of 0.03 ml/min and Ti source at a rate of 0.1 ml/min (denoted to Sr:Ti=0.03:0.1 ml/min), and the other STO layer is formed by flowing Sr source at a rate of 0.045 ml/min and Ti source at a rate of 0.15 ml/min (denoted to Sr:Ti= 0.034:0.15 ml/min). The two STO layers are formed with $Sr(THD)_2$-pmdt as a Sr precursor and $Ti(THD)_2(O-i-Pr)_2$ as a Ti precursor. Generally, it is known that the STO layer has a best dielectric characteristics when the atomic ratio of Sr:Ti in the STO layer equals to 1:1, however, as shown in FIG. 1, the atomic ratios are varied extremely in accordance with the height.

THD and pmdt represent tetramethylheptanedionate and pentamethyl-diethylenetriamine, respectively. Also, O-i-Pr stands for isopropoxide. Tetraen or tetraene mean a structure with four double bonds; trien or triene mean a structure with three double bonds. Further, THD, MPD and pmdt are represented to chemical equations of $C_{11}H_{19}O_2$, $O_2C_6H_{12}$ and $C_9H_{23}N_3$, respectively.

FIG. 2 shows atomic ratio Ba+Sr/Ti dependency of step coverage, when a BST layer is formed in a three dimensional contact whose critical dimension CD is 0.15 µm. The BST layer are formed with $Ba(METHD)_2$ as a Sa precursor, $Sr(METHD)_2$ as a Sr precursor and Ti (MPD) $(THD)_2$ as a Ti precursor. As mentioned above, the BST layer has a best dielectric characteristics when the atomic ratio of Ba+Sr:Ti in the BST layer equals to 1:1, however, as shown in FIG. 1B, the atomic ratios are varied extremely in accordance with the height.

METHD and MPD represent methoxyethoxyte-tetramethylhepatanedionate and methylpentanediol, respectively.

A BST layer or a STO layer may be formed on a lower electrode as a dielectric layer by the CVD method in the processes for forming a three-dimensional capacitor, the atomic ratio of Ba+Sr:Ti or Sr:Ti is varies in accordance with a deposition height because of the deposition differences of Ba, Sr and Ti elements, moreover as the decrease of the design rule, the variation of the atomic ratio becomes larger. If the atomic ratios of the BST layer or the STO layer are quite different from each stoichiometry, the BST layer or the STO layer cannot have the perovskite structure even after an annealing process, and it is impossible to increase the dielectric constant of each layer.

Therefore, it is worthy to note that the ALD method capable of overcoming the problems of composition variation by height change. FIG. 3 shows steps of forming polyatomic layer using the conventional ALD method.

Referring to FIG. 3, a first precursor containing parts of source elements, for example containing Ba and Sr for forming a BST layer, is flowed into a reaction chamber and is absorbed on a substrate on which a polyatomic layer to be formed. Thereafter, remaining first precursors are purged out, and a first reaction gas is flowed into the reaction chamber in order to induce a surface reaction with the first precursor absorbed on the substrate, thereby forming a fist unit layer. And then, remaining first reaction gas and accessory products are purged out.

Subsequently, a second precursor containing other parts of elements, for example Ti for forming a BST layer, is flowed into the reaction chamber and, is absorbed on the substrate on which the first unit layer is already formed. Thereafter, remaining second precursors are purged out, and a second reaction gas is flowed into the reaction chamber in order to induce a surface reaction with the second precursor absorbed on the substrate thereby forming a second unit layer. And then, remaining second reaction gas and accessory products are purged out.

As mentioned above, in order to form a polyatomic layer, such as BST or STO, a common process condition in which each element can be deposited is needed. However, it is difficult to obtain a common process condition in the ALD method, because characteristics, such as volatility, thermal decomposition, deposition speed, incorporation efficiency and sticking coefficient, differ greatly with each of the metal organic precursors.

In case of forming a BST layer with an ALD method, a β-diketonate group material, which can be used as a precursor of Ba and Sr, does not react with $O_2$ or $H_2O$, at a low temperature less than 350° C., therefore it is impossible to obtain a atomic deposition processes at the temperature with β-diketonate. On the contrary, it is possible to obtain atomic deposition with Ti $(OC_3H_7)_4$ used as a precursor of Ti at a temperature of 150° C. to 300° C. However $Ti(OC_3H_7)_4$ is re-decomposed around temperature of 300° C., therefore, it is impossible to obtain atomic deposition at such a temperature with $Ti(OC_3H_7)_4$.

As mentioned above it is necessary to make the atomic ratio of Ba+Sr:Ti nearly equal to 1:1 in the BST layer for securing the best dielectric characteristic of BST. Therefore, one atomic unit layer, formed of a precursor containing Ba and Sr, and the other atomic layer, formed of a precursor containing Ti are repeatedly deposited in order to make the atomic ratio of Ba+Sr:Ti equal to 1:1.

However, due to the respective characteristic of the precursors, the deposition temperatures are should be changed. That is, in the step of using the precursor containing Ba and Sr, the reaction chamber should be maintained to a temperature of about 350° C., and in the step of using the precursor containing Ti, the reaction chamber should be maintained to a temperature of 150° C. to 300° C. Actually, it is impossible to change of the reaction chamber in every step for forming each atomic unit layer. Whatever it possible to change the temperature of the reaction chamber in every step, the problems of increasing the number of process step and lowering deposition speed exist.

SUMMARY OF THE DISCLOSURE

Therefore, a method for forming a polyatomic layer, capable of reducing a number of process steps and increasing deposition speed is disclosed.

A method for forming a polyatomic layer with a mixed deposition method consisting of an atomic layer deposition method(ALD) and a chemical vapor deposition method is also disclosed.

In accordance with a disclosed embodiment, a method for forming polyatomic layer comprises: forming a first unit layer having a first element of the polyatomic layer using an atomic layer deposition; and forming a second unit layer having a second element of the polyatomic layer using an chemical vapor deposition.

In accordance with another embodiment, a method for forming polyatomic layer comprises: performing a process for a first precursor being absorbed on a substrate in a chamber, wherein the first precursor containing a first element of the polyatomic layer; purging out the first precursor in the chamber; supplying a first reaction gas in the chamber and forming a first unit layer by inducing a surface reaction between the first reaction gas and the first precursor on the substrate; purging out the first reaction gas and a accessory product in the chamber; supplying a second precursor and a second reaction gas in the chamber and forming a second unit layer, wherein the second precursor containing a second element of the polyatomic layer, and wherein the second precursor and the second reaction gas reacts chemically; and purging out the second precursor, the second reaction gas and a accessory product in the chamber.

Mixed deposition methods consisting of an atomic layer deposition(ALD) method and a chemical vapor deposition (CVD) method for forming a polyatomic layer are also disclosed.

Some elements are deposited by the ALD method, and others are deposited by the CVD method for forming a polyatomic layer. Among various elements, some elements having a higher deposition temperature compared with others are deposited with the ALD method, and the others are deposited the CVD.

In this mixed deposition method, various elements having respective characteristics, such as thermal decomposition, deposition speed, incorporation efficiency and sticking coefficient, are deposited independently with the ALD method and the CVD method. Therefore, it is possible to obtain characteristics, such as good step coverage and abilities of containing impurities and controlling composition, provided by the ALD. In addition, it is possible to improve the deposition speed and to shorten the process time by the CVD.

BRIEF DESCRIPTION OF THE DRAWINGS

The above and other features of the disclosed methods will become apparent from the following description of the preferred embodiments given in conjunction with the accompanying drawings, wherein:

FIG. 4 is a schematic diagram illustrating steps of forming polyatomic layer using a mixed deposition method according to the disclosed methods.

DETAILED DESCRIPTION OF THE PRESENTLY PREFERRED EMBODIMENTS

Figure 1:
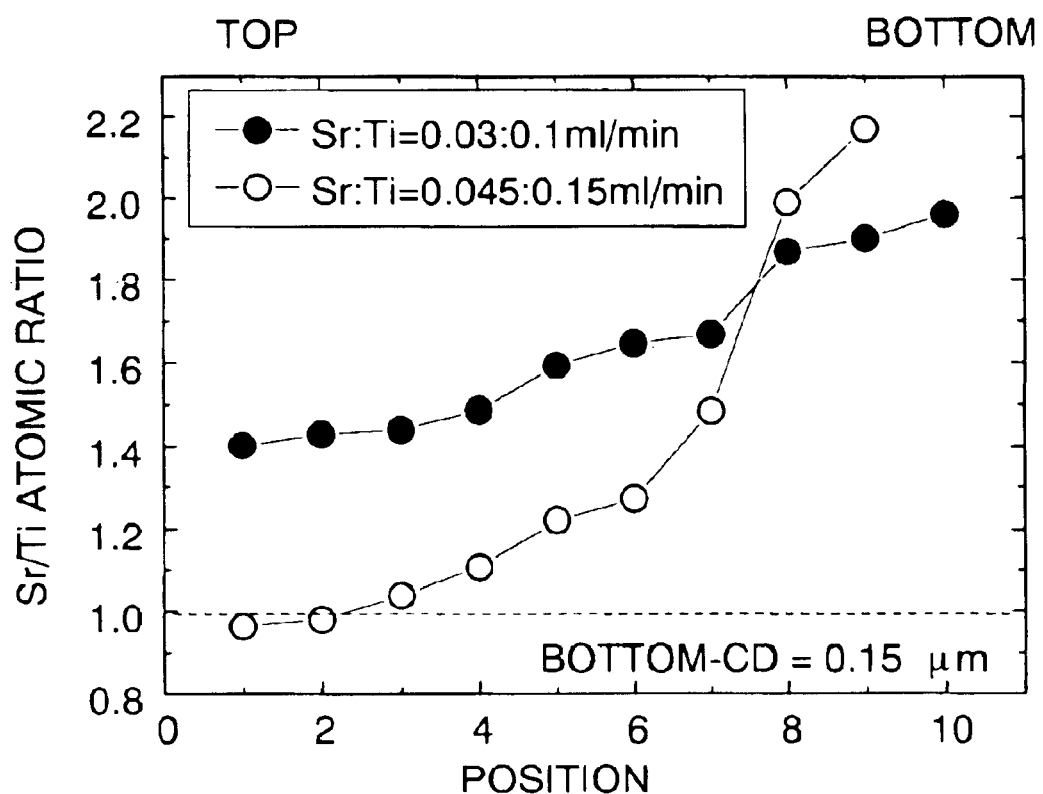
FIG. 1 is a graph illustrating an atomic ratio Sr/Ti dependency of step coverage.
Figure 2:
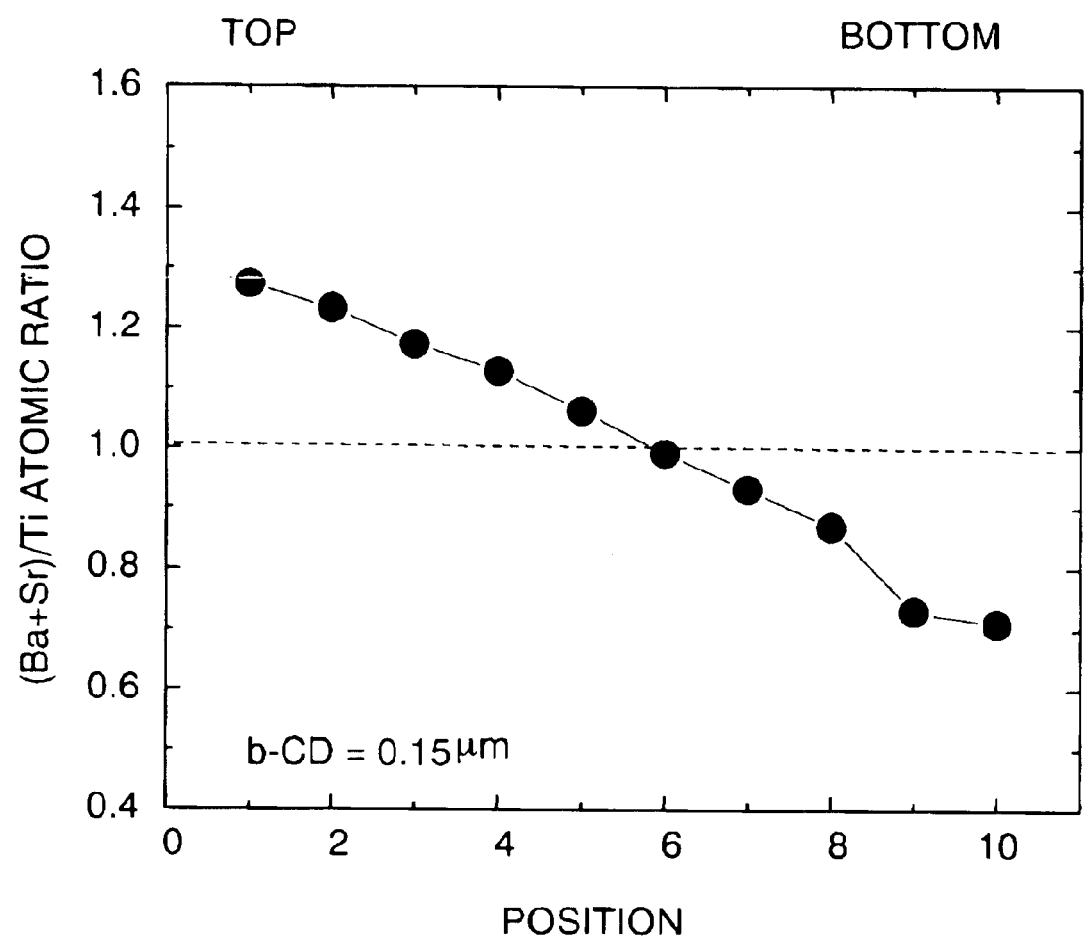
FIG. 2 is a graph illustrating atomic ratio Ba+Sr/Ti dependency of step coverage.
Figure 3:
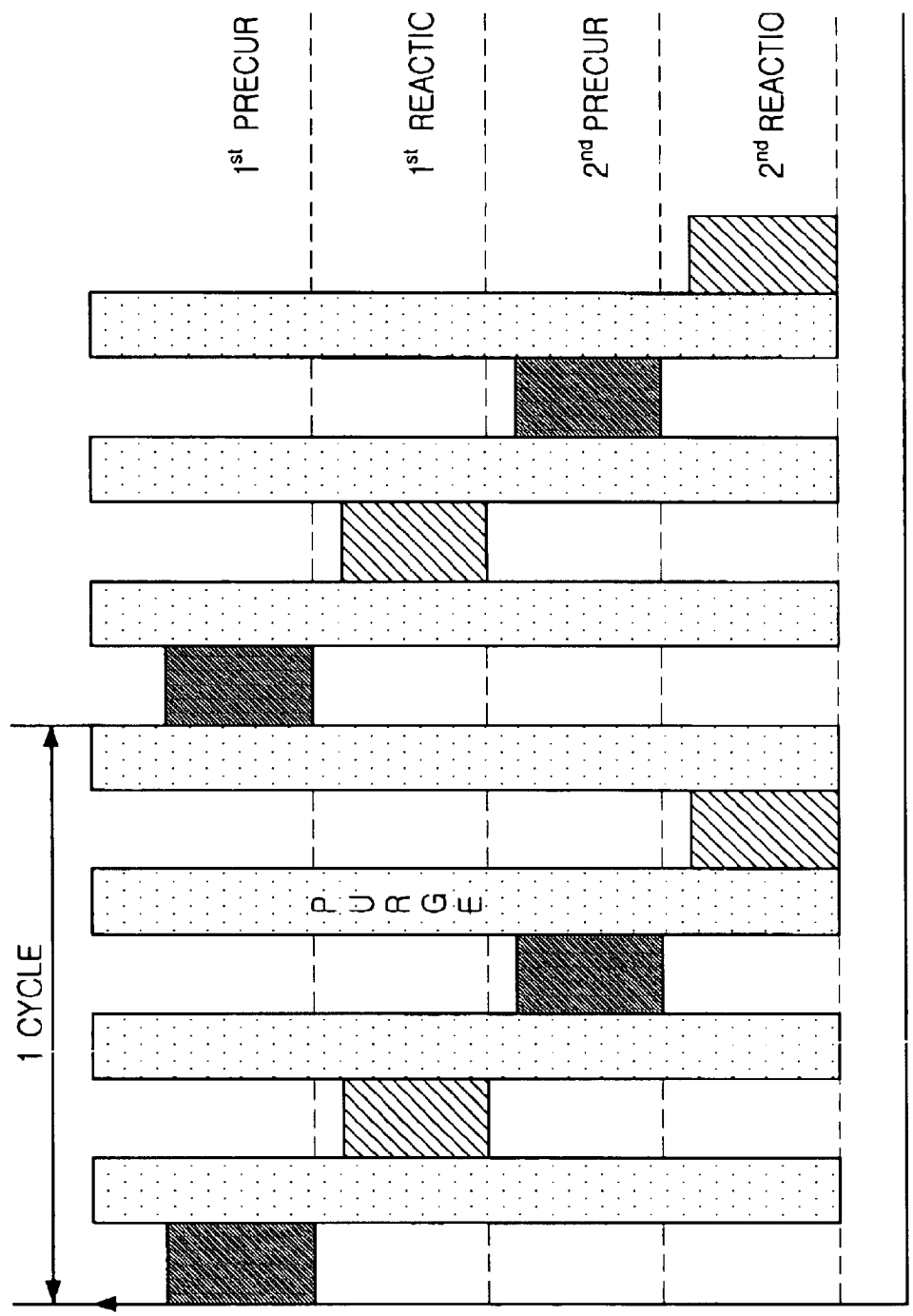
FIG. 3 is a schematic diagram illustrating steps of forming polyatomic layer using a conventional atomic layer deposition method.

FIG. 4 shows steps of forming polyatomic layer using a mixed deposition method consisting of an atomic layer deposition method(ALD) and a chemical vapor deposition (CVD) method. Hereinafter, the method for forming BST layer will be described.

Referring to FIG. 4, a first precursor, containing a Ba source and a Sr source, is flowed into a reaction chamber and is absorbed on a substrate on which a polyatomic layer to be formed. The Ba source is selected from the group consisting of Ba(THD)$_2$-tetraene, Ba(THD)$_2$-triene(Ba(($C_{11}H_{19}O_2$)—$NH_2((C_2H_4)NH(C_2H_4))_2$, Ba(THD)$_2$-pmdt(Ba($C_{11}H_{19}O_2$)$_2$—$C_9H_{23}N_3$), Ba(METHD)$_2$ and Ba ($O_4C_{14}H_{25}$)$_2$. The Sr source is selected from a group consisting of Sr(THD)$_2$-tetraene, Sr(THD)$_2$-triene(Sr($C_{11}H_{19}O_2$)—$NH_2((C_2H_4)NH(C_2H_4))_2$), Sr(THD)$_2$-pmdt(Sr($C_{11}H_{19}O_2$)$_2$—$C_9H_{23}N_3$), Sr(METHD)$_2$ and Sr ($O_4C_{14}H_{25}$)$_2$.

Thereafter, remaining first precursors are purged out, and a first reaction gas, such as $H_2O$ gas or a mixed gas of $H_2O_2$ and $H_2O$ is flowed into the reaction chamber in order to induce a surface reaction with the first precursor absorbed on the substrate, thereby forming a fist unit layer, (Ba, Sr)O layer is deposited. And then, remaining first reaction gas and accessory products are purged out. At this time, an $O_2$ gas, an $O_3$ gas or plasma produced from a $N_2O$ gas, having excellent reactivity, may be used as the first reaction gas.

The first unit layers are formed at a temperature ranging from about 350° C. to about 450° C., because a material of β-diketonate group used as the first precursor does not react at a temperature less than about 350° C.

Subsequently, a second precursor containing Ti elements and a second reaction gas are flowed into the reaction chamber to form a second unit layer $TiO_2$ layer, with the CVD method. At this time, the second precursor is selected from the group consisting of Ti(O-i-Pr)$_4$(Ti(OC$_3$H$_7$)$_4$), Ti(MPD) (THD)$_2$(Ti(O$_2$C$_6$H$_{12}$) (O$_2$C$_{11}$H$_{19}$)$_2$), and Ti(O-t-Bu)$_2$(THD)$_2$(Ti (OC$_4$H$_9$)$_2$(C$_{11}$H$_{19}$O$_2$)$_2$), and the second reaction gas is selected from the group consisting of $O_2$, $N_2O$, $NH_3$ and combinations thereof.

Thereafter, accessory products, the remaining second precursor and the reaction gas are purged out.

By repeating a deposition cycle consisting of the deposition steps for forming the first unit layer and the second unit layer, that is, by depositing the first unit layer and the second unit layer alternately and repeatedly, a desired thickness of the BST layer can be obtained.

After forming the BST layer, a rapid thermal treatment is carried out at a temperature ranging from about 500° C. to about 750° C. in an ambient of $N_2$ for a time period ranging from about 1 minute to about 10 minutes in order to crystallize the BST layer.

In the above mentioned embodiment of the present invention, the first unit layer is formed with the (Ba,Sr)O layer and the second unit layer is formed with the $TiO_3$ layer, however the BST layer can be obtained by forming the first unit layer with the $TiO_3$ layer and forming second layer with the (Ba,Sr)O layer.

In addition, a $SrTiO_3$ layer can be formed using the above mentioned embodiment of the present invention, by supplying a source containing Sr as a first precursor.

Moreover, the present invention can be adopted to form various multitudinous dielectric layer, such as SrBi$_2$Ta$_2$O$_9$ (SBT), Pb(Zr, Ti)O$_3$ (PZT) or (Bi$_x$La$_y$)Ti$_3$O$_{12}$ (BLT) using Zr(O-t-Bu)$_4$, Zr(O-i-Pr)$_4$, Zr(THD)$_4$, Zr(O-i-Pr) (THD)$_3$, Zr(O-t-Bu) (THD)$_3$, Pb(THD)$_2$, Triethylneopentoxylead, Ta(OEt)$_5$, Ta(OiPr)$_5$, La(THD)$_3$, BiPh$_3$, Bi(Ot-Am)$_3$ or Bi(Ot-Bu) as a precursor. The Ot-Am represents tertiary-amyloxy.

The various multitudinous diffusion barrier layer, such as TiAlN, TiSiN, RuTiN or RuTaN can be formed, in this case a precursor is selected from the group consisting of TiCl$_4$, Ti[N(CH$_3$)$_2$]$_4$, Ti[N(C$_2$H$_5$)$_2$]$_4$, Ti[NCH$_3$C$_2$H$_5$]$_4$, Al(CH$_3$)$_3$, SiH$_4$, SiH$_2$Cl$_2$, Ru(EtCp)$_2$, Ru(OD)$_3$, TaCl$_5$, Ta[N(CH$_3$)$_2$]$_4$, Ta[N(C$_2$H$_5$)$_2$]$_4$, Ta[NCH$_3$C$_2$H$_5$]$_4$ and a reaction gas is selected from the group consisting of N$_2$ and NH$_3$. The reaction gas can be replaced with the plasma produced by the N$_2$ and NH$_3$.

FIGS. 5A to 5D are cross sectional views showing a method for forming a capacitor using the mixed deposition method.

Figure 5A:
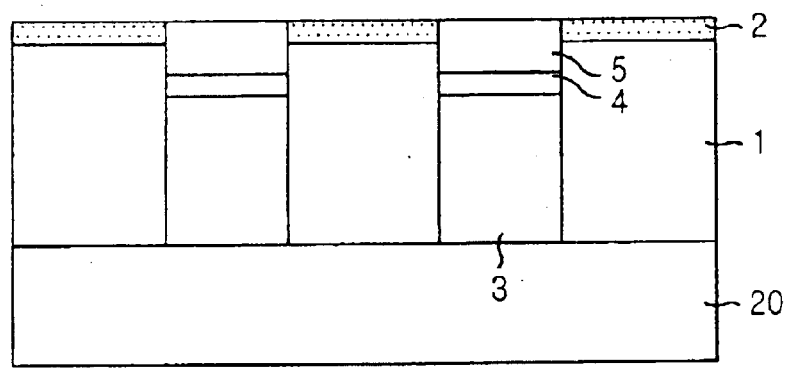
FIGS. 5A to 5E are cross sectional views illustrating a method for forming a capacitor using the mixed deposition method according to the disclosed methods.

Referring to FIG. 5A, an interlayer dielectric(ILD) 1 and etch barrier layer 2 is formed on a semiconductor substrate 20 on which a transistor and a bit line are already formed. The ILD 1 is formed with a silicon oxide layer deposited by a CVD method, and the etch barrier is formed with a SiON layer of which etch selectivity is higher than that of the silicon oxide layer to a thickness ranging from about 300 Å to about 1000 Å.

Thereafter, a contact mask(not shown) is formed on the etch barrier layer 2, and etch barrier layer 2 and the ILD 1 are etched in order to form a contact hole exposing the substrate 20. And, then the contact mask is removed.

Subsequently, a polysilicon layer is formed to a thickness ranging from about 500 Å to about 3000 Å on the substrate including the contact hole, and is removed to form a polysilicon plug 3 in the contact hole.

After cleaning the substrate, a titanium layer is deposited to a thickness ranging from about 100 Å to about 300 Å and a rapid thermal treatment(RTP) is carried out to induce a reaction between Si atoms in the polysilicon plug and the titanium layer for forming a titanium silicide layer 4. The un-reacted titanium layer is removed by an wet etch.

Subsequently, TiCl$_4$, SiH$_4$ and NH$_3$ gases are supplied to the surface of the titanium silicide layer 4 to form a TiSiN layer 5, and the TiSiN layer 5 is removed by a chemical mechanical polishing(CMP) process and an etch back process until the surface of the etch barrier layer is exposed. The TiSiN layer 5 plays a role of diffusion barrier preventing oxygen elements in a lower electrode of capacitor being diffused into the polysilicon plug or the substrate, in a thermal process performed after the formation of a BST layer.

Instead of the TiSiN layer 4, various nitride layers or triatomic layers, such as TiAlN, TaSiN, TaAlN, RuTiN can be formed as the barrier metal layer. These various nitride layers are formed with a CVD or a physical vapor deposition (PVD) method.

Figure 5B:
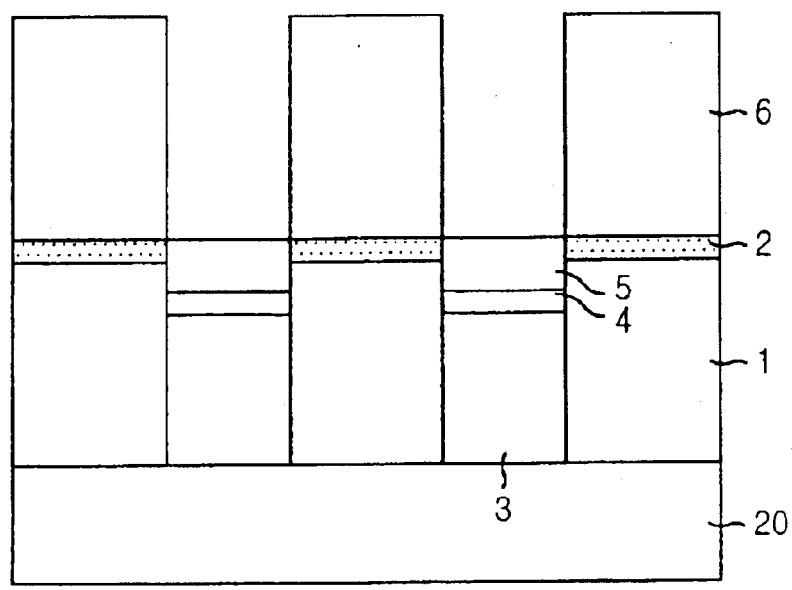

Referring to FIG. 5B, a sacrificial layer 6 for forming a lower electrode of a capacitor is deposited at a thickness ranging from about 200 Å to about 2000 Å, and selectively etched to form an opening aligned on the polysilicon plug 3 using a storage node mask formed of photoresist. The opening is formed to define a region of lower electrode. The sacrificial layer 6 is formed of undoped silicate glass(USG) or phospho silicate glass(PSG).

Figure 5C:
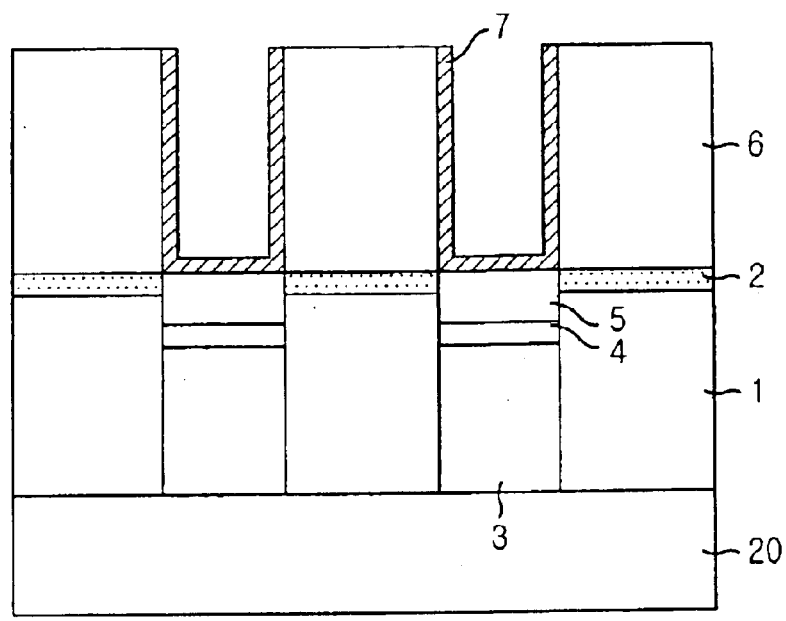

Referring to FIG. 5C, a Ru layer for a lower electrode of a capacitor is formed with a CVD method, and the Ru layer is removed with the CMP or a dry etch back until the surface of the sacrificial layer 6 is exposed, whereby a Ru lower electrode 7 is formed in the opening. At this time, the Ru layer is formed at a temperature ranging from about 200° C. to about 350° C. with a precursor selected from the group consisting of Ru(EtCp)$_2$ and Ru(OD)$_3$, and, after forming the Ru layer, a post thermal treatment is performed with a NH$_3$ gas or plasma produced by NH$_3$ to remove oxygen elements remaining in the Ru layer.

Figure 5D:
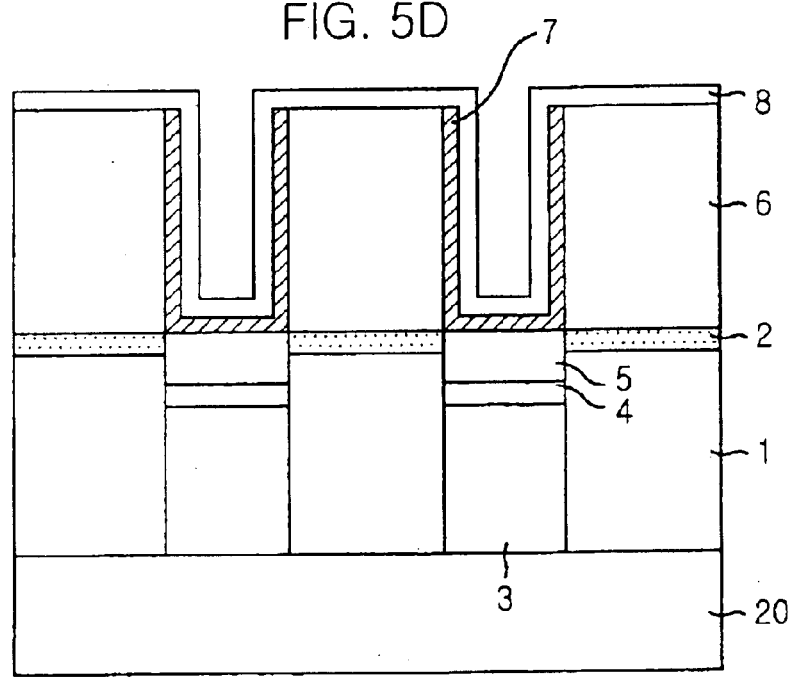

Referring to FIG. 5D, a BST layer 8 is formed on the Ru lower electrode 7 to a thickness ranging from about 50 Å to about 500 Å by a mixed deposition process performed at a temperature from about 300° C. to about 340° C. The mixed deposition process consist of forming (Ba, Sr)o with an ALD method and forming TiO$_2$ with a CVD method. At this time, Ba(THD)$_2$-tetraeneand Sr(THD)$_2$-tetraeneis supplied as precursors, and a H$_2$O gas, mixed gas of H$_2$O$_2$ and H$_2$O or plasma produced from O$_2$ gas, an O$_3$ gas or N$_2$O gas is supplied as a reaction gas. When forming TiO$_2$ with the CVD method, O$_2$, N$_2$O, NH$_3$ or combination thereof is supplied.

Thereafter, a rapid thermal treatment is carried out at a temperature ranging from about 500° C. to about 750° C. in an ambient of N$_2$ for a time period ranging from about 1 minute to about 10 minutes in order to crystallize the BST layer.

Figure 5E:
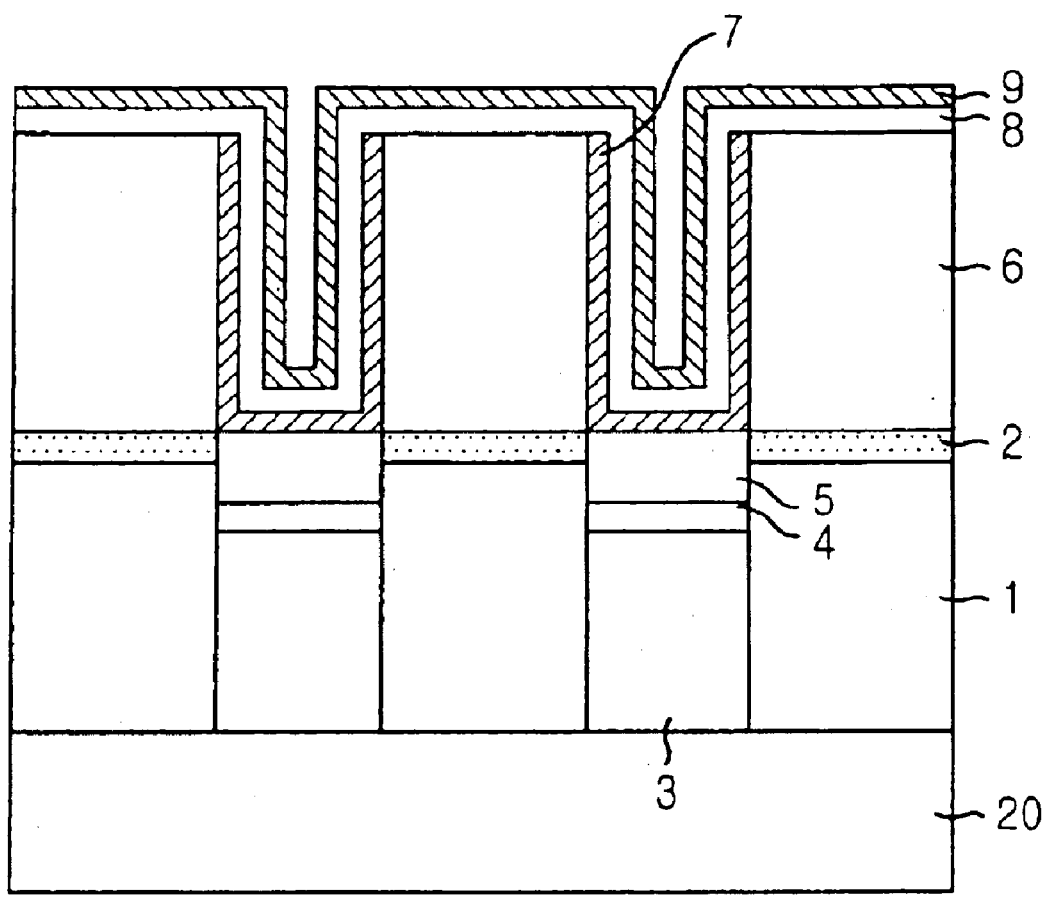

Referring to FIG. 5E, a Ru layer 9 for top electrode is formed on the BST layer at a temperature ranging from about 200° C. to about 350° C. with a metal organic vapor deposition method. Thereafter, a thermal treatment is performed at a temperature ranging from about 250° C. to about 500° C. in an ambient of N$_2$ for a time period ranging from about 10 minutes to about 60 minutes in order to improve characteristic of interface between the BST layer and the top electrode. At this time, a small amount of oxygen gas can be used.

The polyatomic layer, from which it is difficult to obtain good step coverage and composition uniformity, is formed with a mixed deposition method to improve characteristic thereof. The mixed deposition method consists both of the CVD and the ALD. It is possible to reduce the number of processes and to increase deposition speed by the CVD, and it is also possible to improve the step coverage and the composition uniformity by the ALD. The mixed deposition method can be adopted to form the polyatomic high dielectric layer, such as BST or STO. Accordingly, it is possible to form a polyatomic high dielectric layer having a uniform composition distribution, and thereby a high dielectric characteristic and a leakage current characteristic are may be improved.

While the present invention has been described with respect to certain preferred embodiments, it will be apparent to those skilled in the art that various changes and modifications may be made without departing from the scope of the invention as defined in the following claims.

What is claimed is:

1. A method for forming a polyatomic layer comprising:
   forming a first unit layer having a first element of a polyatomic layer using an atomic layer deposition;
   forming a second unit layer having a second element of the polyatomic layer using a chemical vapor deposition; and
   repeating alternate depositions of the first unit layer and the second unit layer to form the polyatomic layer to a desired thickness.

2. The method as recited in claim 1, wherein the forming of the first unit layer and the second unit layer are carried out at substantially the same temperature.

3. A method for forming a polyatomic layer comprising:
   performing a process for a first precursor being absorbed on a substrate in a chamber, wherein the first precursor contains a first element of the polyatomic layer;
   purging out the first precursor in the chamber;
   supplying a first reaction gas in the chamber and forming a first unit layer by inducing a surface reaction between the first reaction gas and the first precursor on the substrate;

purging out the first reaction gas and a any accessory products in the chamber;

supplying a second precursor and a second reaction gas in the chamber and forming a second unit layer, wherein the second precursor contains a second element of the polyatomic layer, and wherein the second precursor and the second reaction gas react chemically;

purging out the second precursor, the second reaction gas and e any accessory products in the chamber; and repeating alternate depositions of the first unit layer and the second unit layer to form the polyatomic layer to a desired thickness.

4. The method as recited in claim 3, wherein the forming of the first unit layer and the second unit layer are carried out at substantially the same temperature.

5. The method as recited in claim 3, wherein the first unit layer and the second unit layer are formed at a temperature ranging from about 300° C. to about 450° C.

6. The method as recited in claim 3, further comprising performing a rapid thermal process at a temperature ranging from about 500° C. to about 700° C. in an ambient of nitrogen for a time period ranging from about 1 minute to about 10 minutes, after forming the first and second unit layers.

7. The method as recited in claim 3, wherein the first precursor comprises a Ba source and a Sr source.

8. The method as recited in claim 7, wherein the second precursor comprises a Ti source.

9. The method as recited in claim 3, wherein the first precursor comprises Sr.

10. The method as recited in claim 7, wherein the first unit layer is a (Ba,Sr)O layer.

11. The method as recited in claim 10, wherein the (Ba,Sr)O layer is formed from $Ba(THD)_2$-tetraene and $Sr(THD)_2$-tetraen.

12. The method as recited in claim 10, wherein the second unit layer is a $TiO_2$ layer.

13. The method as recited in claim 3, wherein the first reaction gas is selected from the group consisting of an $O_2$ gas, an $O_3$ gas and plasma produced from $N_2O$ gas.

14. The method as recited in claim 3, wherein the second reaction gas is selected from the group consisting of $O_2$, a $N_2O$ gas and $NH_3$.

15. The method as recited in claim 7, wherein Ba source is selected from the group consisting of $Ba(THD)_2$-tetraene, $Ba(THD)_2$-triene($Ba(C_{11}H_{19}O_2)$—$NH_2((C_2H_4)NH(C_2H_4))_2$), $Ba(THD)_2$-pmdt($Ba(C_{11}H_{19}O_9)_2$-/$C_9H_{23}N_4$), $Ba(METHD)_2$ and $Ba(O_4C_{14}H_{25})_2$.

16. The method as recited in claim 7, wherein the Sr source is selected from the group consisting of $Sr(THD)_2$-tetraene, $Sr(THD)_2$-triene($Sr(C_{11}H_{19}O_2)$-$NH_2((C_2H_4)NH(C_2H_4))_2$), $Sr(THD)_2$-pmdt($Sr(C_{11}H_{19}O_2)_2$-$C_9H_{23}N_3$), $Sr(METHD)_2$ and $Sr(O_4C_{14}H_{25})_2$.

17. The method as recited in claim 8, wherein the Ti source is selected from the group consisting of $Ti(O-i-Pr)_4$ ($Ti(OC_3H_7)_4$), $Ti(MPD)(THD)_2(Ti(O_2C_6H_{12})(O_2C_{11}H_{19})_2)$, and $Ti(O-t-BU)_2(THD)_2(Ti(OC_4H_9)_2(C_{11}H_{19}O_2)_2)$.

18. The method as recited in claim 8, wherein the polyatomic layer is a layer selected from the group consisting of $Pb(Zr, Ti)O_3$ layer, $SrBi_2Ta_2O_9$ layer, $(Bi_xLa_y)Ti_3O_{12}$ layer, TiAlN layer, TiSiN layer, RuTiN layer and RuTaN layer.

* * * * *

UNITED STATES PATENT AND TRADEMARK OFFICE
CERTIFICATE OF CORRECTION

PATENT NO. : 6,800,567 B2
DATED : October 5, 2004
INVENTOR(S) : Ho Jin Cho

It is certified that error appears in the above-identified patent and that said Letters Patent is hereby corrected as shown below:

Column 9,
Line 1, after "the first reaction gas" please delete "and a any" and insert
-- and any -- in its place.
Line 9, after "and" please delete "e any accessory" and insert
-- any accessory -- in its place.

Column 10,
Line 14, after "-triene(Ba($C_{11}H_{19}$" please delete "$O_2$)—$NH_2$" and insert
-- $O_2$)$NH_2$ -- in its place.
Line 15, after "-/$C_9H_{23}$" please delete "$N_4$" and insert -- $N_3$ -- in its place.

Signed and Sealed this

Nineteenth Day of April, 2005

JON W. DUDAS
*Director of the United States Patent and Trademark Office*